(12) United States Patent
Ashizawa et al.

(10) Patent No.: US 12,398,032 B2
(45) Date of Patent: Aug. 26, 2025

(54) MEMS ELEMENT AND VIBRATION-DRIVEN ENERGY HARVESTING DEVICE

(71) Applicant: Saginomiya Seisakusho, Inc., Tokyo (JP)

(72) Inventors: Hisayuki Ashizawa, Sayama (JP); Noriko Shimomura, Sayama (JP)

(73) Assignee: Saginomiya Seisakusho, Inc., Tokyo (JP)

( * ) Notice: Subject to any disclaimer, the term of this patent is extended or adjusted under 35 U.S.C. 154(b) by 282 days.

(21) Appl. No.: 17/766,824

(22) PCT Filed: Oct. 9, 2020

(86) PCT No.: PCT/JP2020/038349
§ 371 (c)(1),
(2) Date: Apr. 6, 2022

(87) PCT Pub. No.: WO2021/070946
PCT Pub. Date: Apr. 15, 2021

(65) Prior Publication Data
US 2024/0083740 A1     Mar. 14, 2024

(30) Foreign Application Priority Data
Oct. 10, 2019   (JP) ................. 2019-187152

(51) Int. Cl.
*B81B 3/00*     (2006.01)

(52) U.S. Cl.
CPC ...... *B81B 3/0021* (2013.01); *B81B 2201/033* (2013.01); *B81B 2203/0136* (2013.01); *B81B 2207/098* (2013.01)

(58) Field of Classification Search
CPC ........ B81C 1/00571; B81C 2201/0132; B81C 2201/0135; B81C 2201/0142;
(Continued)

(56) References Cited

U.S. PATENT DOCUMENTS

| 2009/0255339 A1 | 10/2009 | McNeil et al. |
| 2016/0016788 A1 | 1/2016 | Yoshioka et al. |

(Continued)

FOREIGN PATENT DOCUMENTS

| JP | 2005-323039 A | 11/2005 |
| JP | 5237705 B2 * | 7/2013 |
| JP | 2018-088780 A | 6/2018 |

OTHER PUBLICATIONS

International Preliminary Report on Patentability dated Apr. 21, 2022, issued in PCT Application No. PCT/JP2020/038349, filed Oct. 9, 2020.
(Continued)

*Primary Examiner* — Alia Sabur
(74) *Attorney, Agent, or Firm* — Workman Nydegger

(57) ABSTRACT

A MEMS element according to the present invention is provided with a base, an insulation layer fixed to one surface of the base, a first upper layer at least portions of which are fixed to the insulation layer, and a second upper layer provided surrounding the first upper layer and disposed being separated from the first upper layer by slits, wherein the first upper layer includes, at predetermined portions, protruding portions protruding toward the second upper layer, and the protruding portions are fixed to the insulation layer.

9 Claims, 7 Drawing Sheets

(58) Field of Classification Search
CPC ......... B81B 2201/11; B81B 2203/0136; B81B 7/0009; B81B 2201/0285; B81B 2201/033; B01B 2203/0136; H01L 23/49544; H01L 21/4839; H01L 21/4846
See application file for complete search history.

(56) References Cited

U.S. PATENT DOCUMENTS

| | | | |
|---|---|---|---|
| 2018/0003501 A1* | 1/2018 | Yoshida | H10N 30/20 |
| 2019/0023563 A1* | 1/2019 | Ogawa | B81C 1/00579 |
| 2021/0119556 A1 | 4/2021 | Toshiyoshi et al. | |

OTHER PUBLICATIONS

International Search Report dated Dec. 22, 2020, issued in PCT Application No. PCT/JP2020/038349, filed Oct. 9, 2020.
Extended European Search Report dated Sep. 25, 2023, issued in European Application No. 20873838.5.

* cited by examiner

MEMS ELEMENT AND VIBRATION-DRIVEN ENERGY HARVESTING DEVICE

TECHNICAL FIELD

The present invention relates to a MEMS element and a vibration-driven energy harvesting device.

BACKGROUND ART

MEMS elements which are produced on a silicon on insulator (SOI) substrate by forming fixed portions including fixed comb teeth and a moveable portion including movable comb teeth on an insulation layer made of a silicon oxide layer or the like formed on a silicon substrate are known. At least portions of each of the fixed portions and the moveable portion are fixed to the insulation layer. The fixed portions are each formed with a lead portion connected to an electrode terminal. In some configuration, an outer peripheral fixed pattern is formed around the fixed portions including the lead portions.

The fixed portions, the moveable portion, and the outer peripheral fixed pattern are separated from one another by narrow slits formed by etching and are electrically insulated from one another. When the slits are formed by etching, fixed spots fixed to the insulation layer are undercut, and thus, for example, portions having a narrow width at its fixed spots, such as the lead portions, become insufficient in a strength of bonding, so as to be suspended over the insulation layer or broken at a fixed spot by a slight impact.

In light of such circumstances, coping with a decrease in strength of the insulation layer by undercutting is demanded.

There is known a method that does not deal with lead portions but relates to a method for forming slits between fixed portions and a moveable portion. In this method, slits are formed, protective films are then formed on lateral surfaces of the fixed portions, and an insulation layer is removed. In this manner, undercutting of the insulation layer under the fixed portions is prevented, and a strength of bonding of the insulation layer under the fixed portions is kept. This method will be described below.

First, a photoresist is applied to the entire surfaces of the fixed portions and the moveable portion including slits, this photoresist is patterned, and the photoresist on other than surrounding lateral surfaces of the fixed portions is removed by RIE (Reactive Ion Etching) or the like. Next, ashing is performed with oxygen plasma or the like to leave the photoresist on only lateral surfaces of the fixed portions facing the moveable portion. When wet etching using etchant is performed thereafter, the left photoresist serves as protective films against the etching, the etching is prevented on portions where the protective films are formed, so that undercutting of lower portions of the fixed portions and the insulation layer can be prevented (e.g., see Patent Literature 1).

CITATION LIST

Patent Literature

Patent Literature 1: Japanese Patent Laid-Open No. 2005-323039
Patent Literature 2: Japanese Patent Laid-Open No. 2018-88780

SUMMARY OF INVENTION

Technical Problem

The method described in Patent Literature 1 has poor productivity, increasing costs because its processing process is long and complicated.

Solution to Problem

A MEMS element according to a first aspect of the present invention includes a base, an insulation layer fixed to one surface of the base, a first upper layer at least portions of which are fixed to the insulation layer, and a second upper layer provided surrounding the first upper layer and disposed being separated from the first upper layer by slits, the first upper layer includes protruding portions protruding toward the second upper layer, and the protruding portions are fixed to the insulation layer.

According to a second aspect of the present invention, in the MEMS element according to the first aspect, the first upper layer preferably includes lead portions, and the protruding portions are preferably provided on the lead portions.

According to a third aspect of the present invention, in the MEMS element according to the first or second aspect, the insulation layer is preferably removed in regions corresponding to the slits, and the base is preferably exposed in a thickness direction of the insulation layer through at least some of the regions corresponding to the slits.

According to a fourth aspect of the present invention, in the MEMS element according to any one of the first to third aspects, the second upper layer is preferably fixed to the insulation layer.

According to a fifth aspect of the present invention, in the MEMS element according to any one of the first to fourth aspects, the base, the first upper layer, and the second upper layer are preferably made of silicon.

According to a sixth aspect of the present invention, in the MEMS element according to any one of the first to fifth aspects, the insulation layer is preferably made of an inorganic insulation material.

According to a seventh aspect of the present invention, in the MEMS element according to any one of the first to sixth aspects, the first upper layer preferably includes a plurality of fixed comb teeth, and the insulation layer is preferably removed in regions corresponding to between the fixed comb teeth formed adjacently.

A vibration-driven energy harvesting device according to an eighth aspect of the present invention includes the MEMS element according to the seventh aspect, a moveable portion including a plurality of movable comb teeth meshing with the fixed comb teeth of the first upper layer, elastically-supporting portions elastically supporting the moveable portion, and an output portion outputting electric power that is generated by movement of electric charge occurring by relative movement between the fixed comb teeth and the movable comb teeth.

Advantageous Effects of Invention

According to the present invention, it is possible to prevent a decrease in a strength of fixing the first upper layer and to improve productivity.

DESCRIPTION OF EMBODIMENTS

An embodiment for carrying out the present invention will be described below with reference to the drawings.

Figure 1:
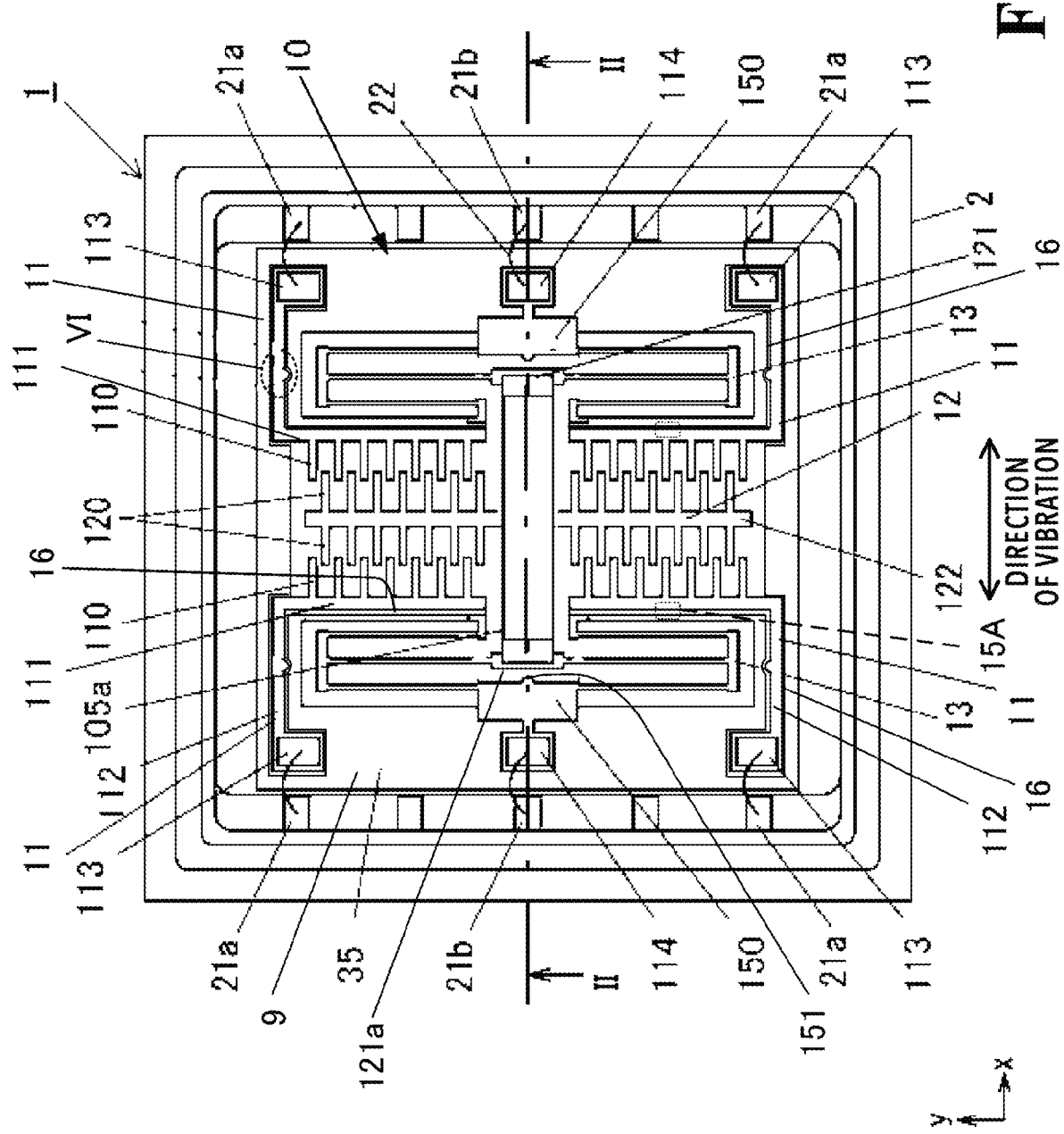
FIG. 1 is a plan view of a vibration-driven energy harvesting device, which is penetrated an upper cover, with a MEMS element enclosed in a vacuum package.
Figure 2:
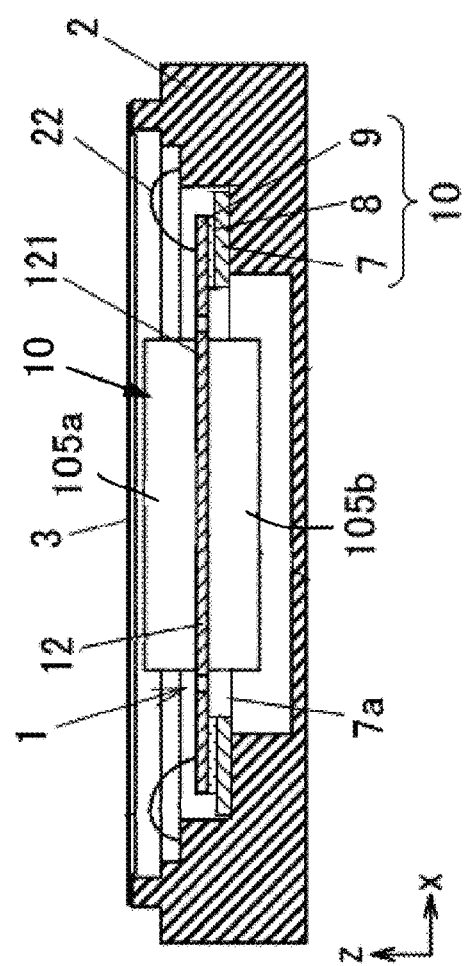
FIG. 2 is a cross-sectional view of the vibration-driven energy harvesting device illustrated in FIG. 1 taken along the line II-II.

FIG. 1 is a plan view of a vibration-driven energy harvesting device 1, which is penetrated an upper cover 3, with a MEMS element 10 enclosed in a vacuum package, and FIG. 2 is a cross-sectional view taken along the line II-II in FIG. 1.

The case 2 and the upper cover 3 forms the vacuum package, and the MEMS element 10 is housed in this vacuum package. In the plan view of FIG. 1, the upper cover 3 provided on an upper side (a positive z-axis direction side) is not illustrated for illustrating a planar structure of the MEMS element 10 clearly.

Note that, in the present embodiment, an x-axis direction, a y-axis direction, and the z-axis direction are supposed to be the respective directions illustrated in each drawing.

The MEMS element 10 includes four fixed electrode portions (first upper layer) 11, a fixed-electrode outer periphery portion (second upper layer) 35 surrounding the fixed electrode portions 11, a movable electrode portion (moveable portion) 12, and elastically-supporting portions 13 elastically supporting the movable electrode portion 12. As illustrated in FIG. 2, a base 7 of the MEMS element 10 is fixed to the case 2 by die bonding. The case 2 is formed of, for example, an electrical insulation material (e.g., ceramic). To an upper end of the case 2, the upper cover 3 for vacuum sealing the inside the case 2 is seam welded.

As illustrated in FIG. 2, the MEMS element 10 includes the base 7 made of Si, a device layer 9 made of a Si active layer, and an insulation layer 8 made of an inorganic insulation material, such as $SiO_2$, that bonds the base 7 and the device layer 9 together. That is, the MEMS element 10 is configured as a three-layered structure in which the base 7, the insulation layer 8, and the device layer 9 made of the Si active layer are stacked in the z-axis direction. The MEMS element 10 having such a configuration is usually formed from SOI (Silicon On Insulator) substrate by a general MEMS process technique.

The device layer 9 includes the four fixed electrode portions 11, the fixed-electrode outer periphery portion 35, the movable electrode portion 12, and the elastically-supporting portions 13. The fixed electrode portions 11 each include a plurality of fixed comb teeth 110, a fixed-comb-teeth connecting portion 111 connecting the plurality of fixed comb teeth 110, and a lead portion 112. The fixed comb teeth 110 are made to extend in the x-axis direction and are arranged in the y-axis direction at predetermined intervals. The fixed-comb-teeth connecting portions 111 are made to extend in the y-axis direction and each connect the plurality of fixed comb teeth 110 arranged in the y-axis direction. The lead portions 112 are made to extend in a direction perpendicular to the fixed-comb-teeth connecting portions 111, that is, in the x-axis direction. The end of the lead portions 112 includes an end portion that is formed with a terminal portion having a rectangular shape. On an upper surface of this terminal portion, a conductive metal such as aluminum is provided and formed as an electrode pad 113.

At a predetermined spot on one lateral surface of the lead portion 112, which extends in the x-axis direction (see a region VI), a protruding portion 15 protruding toward the fixed-electrode outer periphery portion 35 (see FIG. 6) is provided. The protruding portion 15 provided on the lead portion 112 will be described later.

Figure 3:
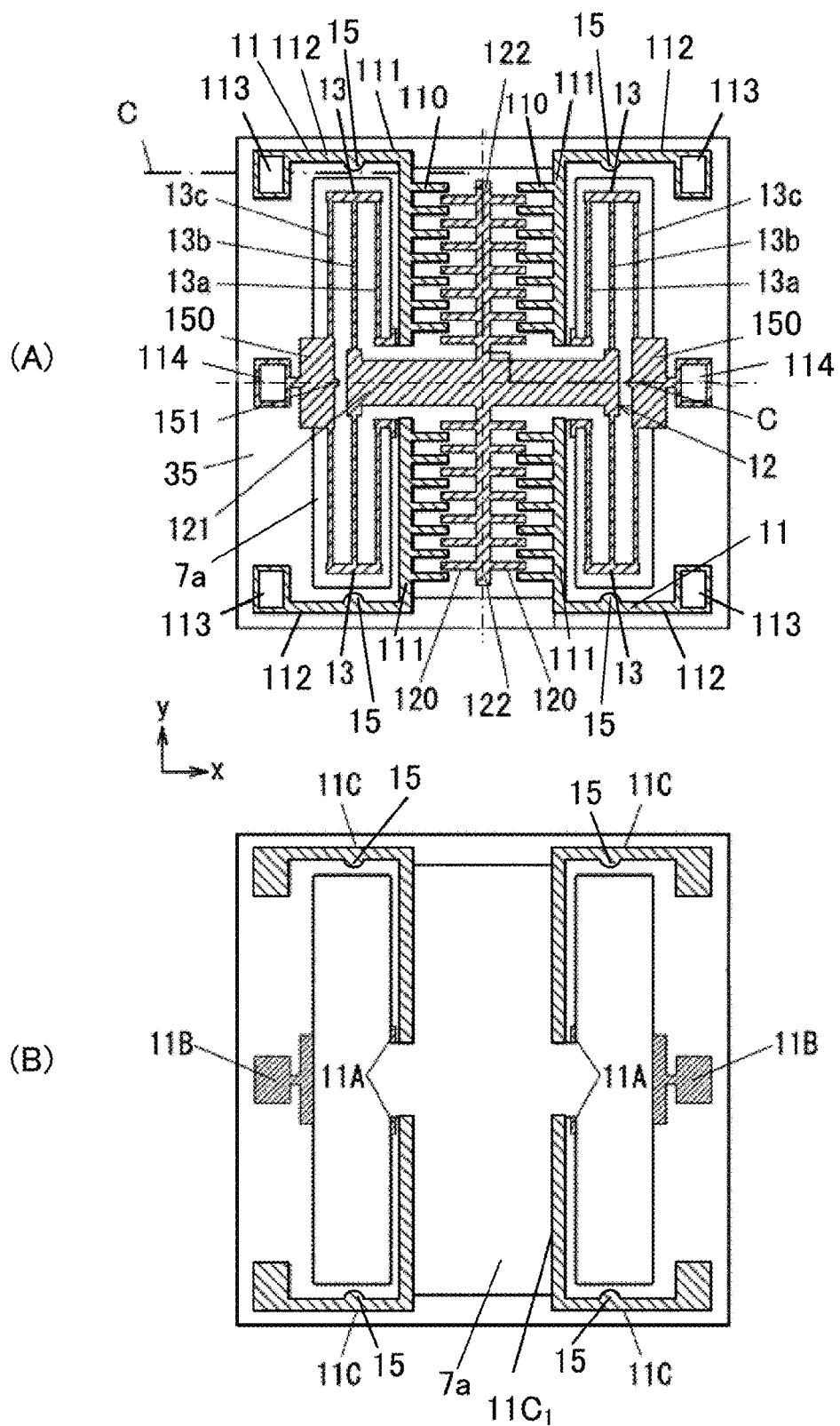
FIG. 3(A) is a plan view of the MEMS element illustrated in FIG. 1.
FIG. 3(B) is a plan view illustrating a state where fixed electrode portions and movable electrode portion are removed from the MEMS element illustrated in FIG. 3(A).

Between the fixed-electrode outer periphery portion 35, and the lead portion 112 and the fixed-comb-teeth connecting portion 111 of each fixed electrode portion 11, a slit 16 is provided, by which the fixed-electrode outer periphery portion 35 is physically separated from the lead portion 112 and the fixed-comb-teeth connecting portion 111 of each fixed electrode portion 11. In this configuration, the fixed-electrode outer periphery portion 35 and each fixed electrode portion 11 are electrically insulated from each other. The lead portion 112 and the fixed-comb-teeth connecting portion 111 of each fixed electrode portion 11 are supported by the base 7 with the insulation layer 8 interposed therebetween. The fixed comb teeth 110 of each fixed electrode portion 11 are extended over a region corresponding to a rectangular shaped opening 7a (see FIG. 2 and FIGS. 3(A) and 3(B)) in the base 7.

The movable electrode portion 12 includes a plurality of movable comb teeth 120, a center band portion 121, and a movable-comb-teeth connecting portions 122 connecting the plurality of movable comb teeth 120. The movable-comb-teeth connecting portions 122 are made to extend from a center of the center band portion 121 in the x-axis direction to positive and negative y-axis directions. The movable comb teeth 120 are made to extend in positive and negative x-axis directions from the movable-comb-teeth connecting portions 122 made to extend in the positive and negative y-axis directions and are arranged in the y-axis direction at predetermined intervals.

As illustrated in FIG. 2, weights 105a and 105b are fixed to upper and lower surfaces of the center band portion 121 of the movable electrode portion 12, which are surfaces on positive and negative z-axis direction sides of the center band portion 121, respectively, by bonding or the like. Positions of gravity centers of the weights 105a and 105b are coaxial with a z-axis that passes through centers of the center band portion 121 in the x-axis direction and the y-axis direction.

Two of the fixed electrode portions 11 disposed on the positive y-axis direction side of the center band portion 121 are disposed to have a line symmetry with respect to a center line of the center band portion 121 in the x-axis direction. The other two of the fixed electrode portions 11 disposed on the negative y-axis direction side of the center band portion 121 are disposed to have a line symmetry with respect to the center line of the center band portion 121 in the x-axis direction.

The plurality of fixed comb teeth 110 extending in the x-axis direction from the fixed-comb-teeth connecting portions 111 and the movable comb teeth 120 made to extend in the x-axis direction from the movable-comb-teeth connecting portions 122 are disposed such that the fixed comb teeth 110 and the movable comb teeth 120 mesh with each other in the y-axis direction with gaps interposed therebetween.

The movable electrode portion 12 is mechanically and electrically connected to a vibration regulating portions 150, which is fixed to the base 7 via the insulation layer 8, via the elastically-supporting portions 13. The vibration regulating portions 150 are provided one by one on the positive and negative x-axis direction sides of the center band portion 121, that is, in a pair. The pair of vibration regulating portions 150 are formed into the same shape and are disposed to have line symmetries with respect to central axes of the center band portion 121 in the x-axis direction and the y-axis direction.

The movable electrode portion 12 supported by the elastically-supporting portions 13 vibrates in the x-axis direction by vibration from the outside, and one side surface 121a of the center band portion 121 of the movable electrode portion 12 collides with a projection 151 of the vibration regulating portion 150. At this time, if a position in the y-axis direction of the projection 151 of the vibration regulating portion 150 with which the moveable portion collides deviates in the y-axis direction from a central axis passing through a gravity center of the center band portion 121 including the weights 105a and 105b, a moment occurs in the center band portion 121 of the movable electrode portion 12. When a moment occurs in the center band portion 121 of the movable electrode portion 12, the elastically-supporting portion 13 deforms, not allowing the center band portion 121 to vibrate normally. It is therefore necessary for a center line in the y-axis direction of contact portions of the vibration regulating portions 150 with which the center band portion 121 of the movable electrode portion 12 collides to be coaxial with the center line of the center band portion 121 of the movable electrode portion 12 extending in the x-axis direction.

To the vibration regulating portions 150, electrode pads 114 are connected. The vibration regulating portions 150 are each formed integrally with a terminal portion having a rectangular shape, and on an upper surface of this terminal portion, a conductive metal such as aluminum is provided and formed as the electrode pad 114.

The electrode pads 113 and 114 are connected to electrodes 21a and 21b provided on the case 2 by wires 22, respectively.

The fixed electrode portions 11 and the movable electrode portion 12 are each formed with electrets. In a case where only one of either the fixed electrode portions 11 or the movable electrode portion 12 is formed with electrets, an electric charge of the reversed polarity is produced in the other, and therefore, only one of either the fixed electrode portions 11 or the movable electrode portion 12 may be formed with electrets.

In the present embodiment, the movable electrode portion 12 is adapted to vibrate in the x-axis direction, and when the movable electrode portion 12 vibrates in the x-axis direction, a degree of insertion of the movable comb teeth 120 of the movable electrode portion 12 relative to the fixed comb teeth 110 of the fixed electrode portions 11 changes, causing movement of an electric charge, by which electric power generation is performed.

FIG. 3(A) is a diagram illustrating the MEMS element 10 before the weights 105a and 105b are fixed thereto.

As described above, the MEMS element 10 is formed from SOI (Silicon On Insulator) substrate by a general MEMS process technique. An SOI substrate is configured to have a three-layered structure in which the base 7, the insulation layer 8, and the device layer 9 made of a Si active layer are stacked in the z-axis direction. As illustrated in FIG. 2, the device layer 9 is supported by the base 7 via the insulation layer 8. The fixed electrode portions 11, the fixed-electrode outer periphery portion 35, the movable electrode portion 12, the elastically-supporting portions 13, and the vibration regulating portions 150 are each formed of a Si active layer.

In FIG. 3(A), the fixed electrode portions 11, the movable electrode portion 12, the elastically-supporting portions 13, and the vibration regulating portions 150 on the base 7 are illustrated by hatching them. The movable electrode portion 12 is elastically supported by four elastically-supporting portions 13. The elastically-supporting portions 13 each include three beams 13a to 13c elastically deformable. The movable electrode portion 12 is disposed in a region that corresponds to the opening 7a (see FIG. 3(B)) provided in the base 7. Via the beams 13a to 13c of the elastically-supporting portions 13, the movable electrode portion 12 is connected to the vibration regulating portions 150. The vibration regulating portions 150 are fixed to the base 7 via the insulation layer 8. As a result, the movable electrode portion 12 is supported by the base 7 via the four elastically-supporting portions 13 and the vibration regulating portions 150.

The vibration regulating portions 150 also function as restricting portions that restrict a vibration range of movable electrode portion 12 in the x-axis direction. The vibration of the movable electrode portion 12 in the x-axis direction is restricted by collision of the movable electrode portion 12 with the projection 151 of each vibration regulating portion 150.

FIG. 3(B) is a plan view illustrating a state where the fixed electrode portions and the movable electrode portion are removed from the MEMS element illustrated in FIG. 3(A).

Hatched zones 11C in FIG. 3(B) illustrate a pattern of bonding portions at which the fixed-comb-teeth connecting portions 111 and the lead portions 112 of the fixed electrode portions 11 are bonded to the insulation layer 8. Hatched zones 11A in FIG. 3(B) illustrate a pattern of bonding portions at which end portions of the beams 13a of the elastically-supporting portions 13 are bonded to the insulation layer 8. Hatched zones 11B in FIG. 3(B) illustrate a pattern of bonding portions at which the vibration regulating portions 150 are bonded to the insulation layer 8.

Next, a producing method for the MEMS element 10 will be described.

Figure 4:
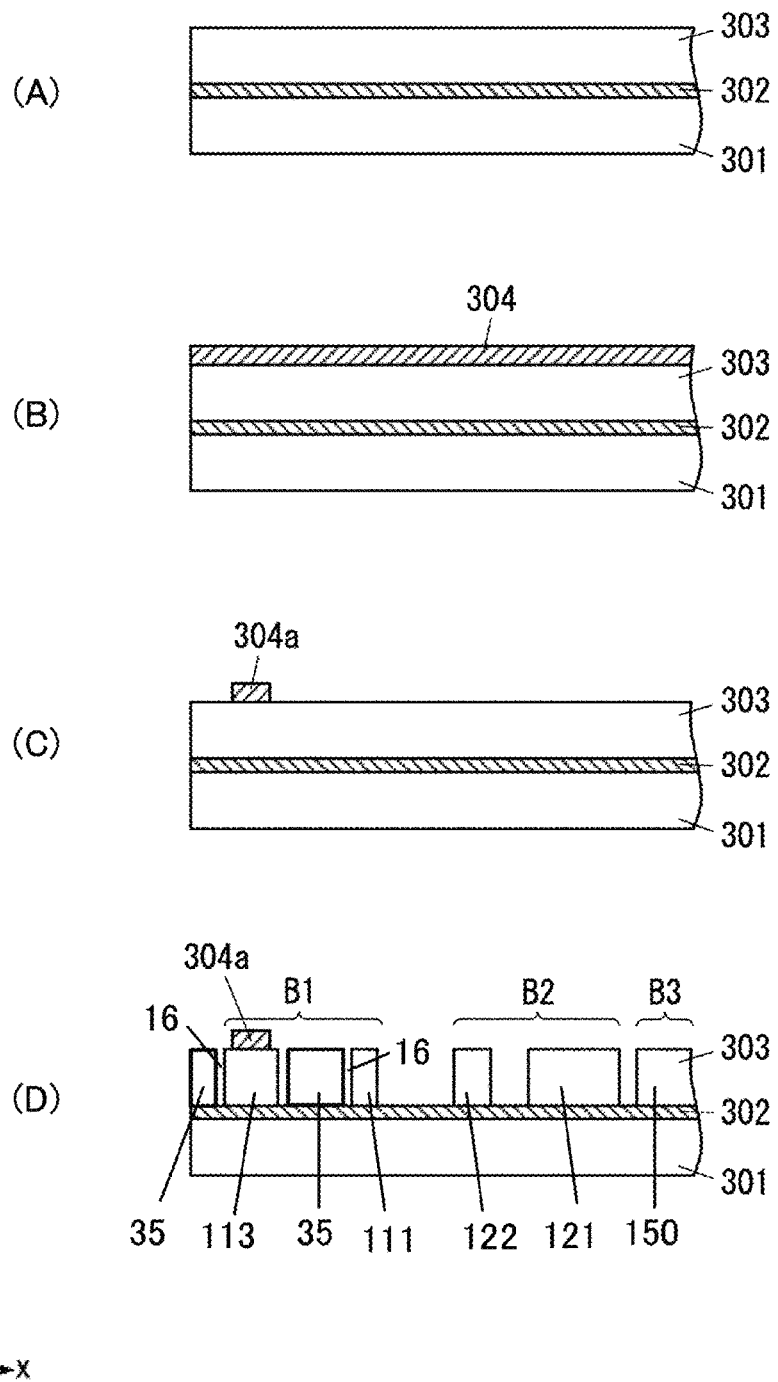
FIG. 4(A) to FIG. 4(D) are diagrams illustrating an example of a production method for the MEMS element illustrated in FIG. 3.

FIG. 4(A) to FIG. 4(D) are diagrams illustrating an example of the production method for the MEMS element illustrated in FIG. 3, and FIG. 5(A) to FIG. 5(D) are diagrams illustrating the example of the production method for the MEMS element subsequent to FIG. 4.

Figure 5:
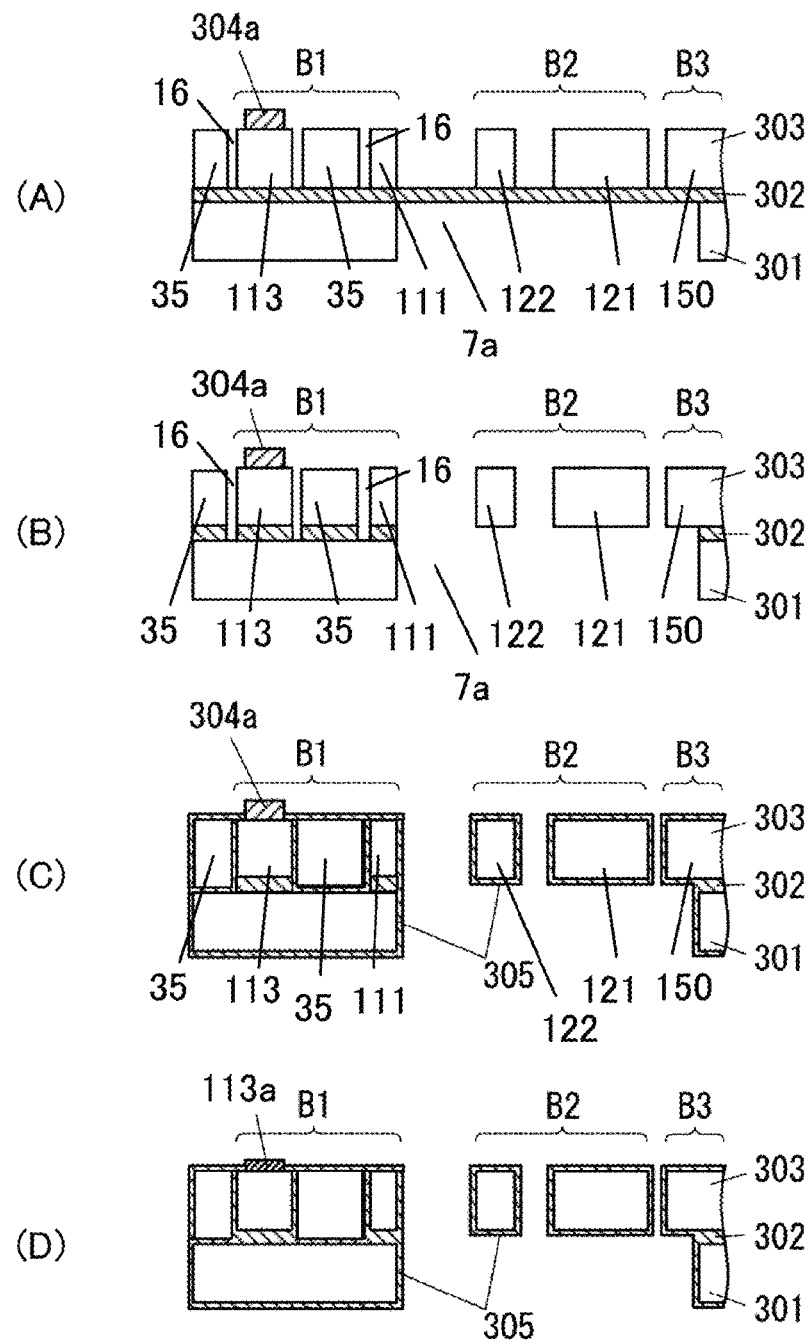
FIG. 5(A) to FIG. 5(D) are diagrams illustrating the example of the production method for the MEMS element subsequent to FIG. 4.

Note that FIG. 4 and FIG. 5 schematically illustrate cross sections taken along the dash-dot line C-C in FIG. 3(A).

FIG. 4(A) is a diagram illustrating a cross section of the SOI substrate that forms the MEMS element 10. The SOI substrate includes a base layer 301 made of Si, an insulation layer 302 made of $SiO_2$, and a device layer 303 made of a Si active layer. In a first step illustrated in FIG. 4(B), a nitride film (SiN film) 304 is deposited on a surface of the device layer 303. In a second step illustrated in FIG. 4(C), the nitride film 304 is patterned into a nitride film pattern 304a for protecting spots at which the electrode pads 113 and 114 are to be formed.

In a third step illustrated in FIG. 4(D), a mask pattern for forming the fixed electrode portions 11, the movable electrode portion 12, the elastically-supporting portions 13, and the vibration regulating portions 150 is formed and disposed on the device layer 303, and the device layer 303 is etched. The etching process is performed by DRIE (Deep Reactive Ion Etching) or the like until the insulation layer 302 is reached. In FIG. 4(D), an area indicated by reference character B1 is an area that corresponds to the fixed electrode portion 11, an area indicated by reference character B2 is an area that corresponds to the movable electrode portion 12, and an area indicated by reference character B3 is an area that corresponds to the vibration regulating portion 150.

In the cross section taken along the dash-dot line C-C in FIG. 3(A), the fixed electrode portion 11 indicated by reference character B1 includes the electrode pad 113 and the fixed-comb-teeth connecting portion 111, the movable electrode portion 12 indicated by reference character B2 includes the movable-comb-teeth connecting portion 122 and the center band portion 121, and the area indicated by reference character B3 includes the vibration regulating portion 150 and the electrode pad 114. Note that illustration of the electrode pad 114 is omitted.

In addition, the fixed-electrode outer periphery portion 35 is formed on the outside of the electrode pad 113 in the negative x-axis direction and between the electrode pad 113 and the fixed-comb-teeth connecting portion 111. The slit 16 is formed between the outside of the electrode pad 113 and the electrode pad 113, between the electrode pad 113 and the fixed-electrode outer periphery portion 35, and between the fixed-electrode outer periphery portion 35 and the fixed-comb-teeth connecting portion 111.

In a fourth step illustrated in FIG. 5(A), a mask pattern for forming the opening 7a in the base 7 is formed on a lower surface of the base layer 301, and the base layer 301 is processed by the DRIE. The opening 7a is thereby formed in the base layer 301, and the base layer 301 is formed into the base 7 having the opening 7a. In a fifth step illustrated in FIG. 5(B), the insulation layer 302 made of $SiO_2$ that is exposed through the opening 7a of the base layer 301 is removed by strong hydrofluoric acid.

Note that, in FIG. 5(B), only the fixed-comb-teeth connecting portion 111 that is a portion of the fixed electrode portion 11 and only the movable-comb-teeth connecting portion 122 and the center band portion 121 that are portions of the movable electrode portion 12 are illustrated. Although the movable-comb-teeth connecting portion 122 and the center band portion 121 are illustrated in FIG. 5(B) in a state of floating over the base layer 301, the movable electrode 12 is supported via the vibration regulating portions 150 fixed to portions of the insulation layer 8 illustrated as the hatched zones 11B and via the elastically-supporting portions 13 connected to the vibration regulating portions 150, as illustrated in FIG. 3(B).

In a sixth step illustrated in FIG. 5(C), silicon dioxide films 305 are formed on surfaces of the base layer 301 and the device layer 303 by a thermal oxidation process. At this time, the silicon dioxide films 305 are also formed on lateral surfaces of the fixed electrode portion 11 in the slit 16 and lateral surfaces of the fixed-electrode outer periphery portion 35 in the slit 16. In a sixth step illustrated in FIG. 5(D), the nitride film pattern 304a is removed, and an aluminum electrode 113a is deposited in a zone of the removal, by which the electrode pad 113 is formed. Note that the electrode pads 114 are also formed at this time, but the electrode pads 114 are formed out of the range of FIG. 5(D) and are not illustrated in FIG. 5(D).

Through the processing procedure described above, the MEMS element 10 is formed.

Thereafter, electrets are formed on at least one of either the fixed comb teeth 110 or the movable comb teeth 120 by a well-known electret forming method (e.g., see Japanese Patent Publication No. 5627130, etc.).

The vibration-driven energy harvesting device 1 is a very minute structure processed by a MEMS technology, and lengthwise and breadthwise dimensions of the package 2 illustrated in FIG. 1 are each several centimeters, and a height dimension of the package 2 is about several millimeters.

Figure 6:
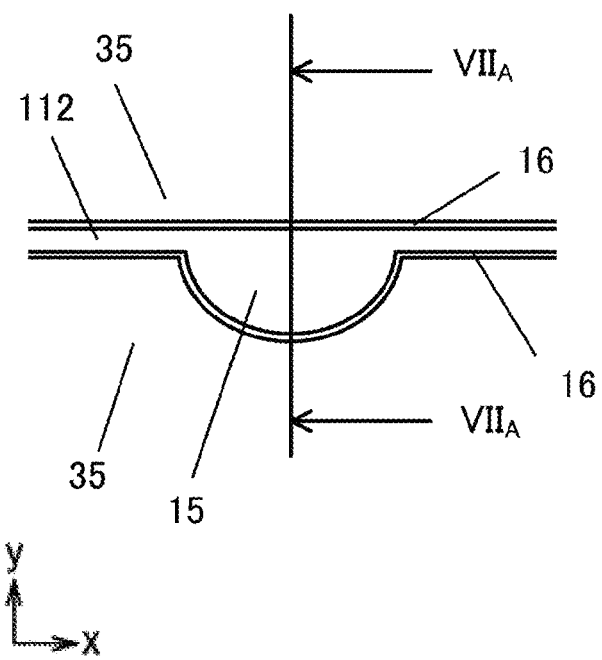
FIG. 6 is an enlarged view of a region VI in FIG. 1.
Figure 7:
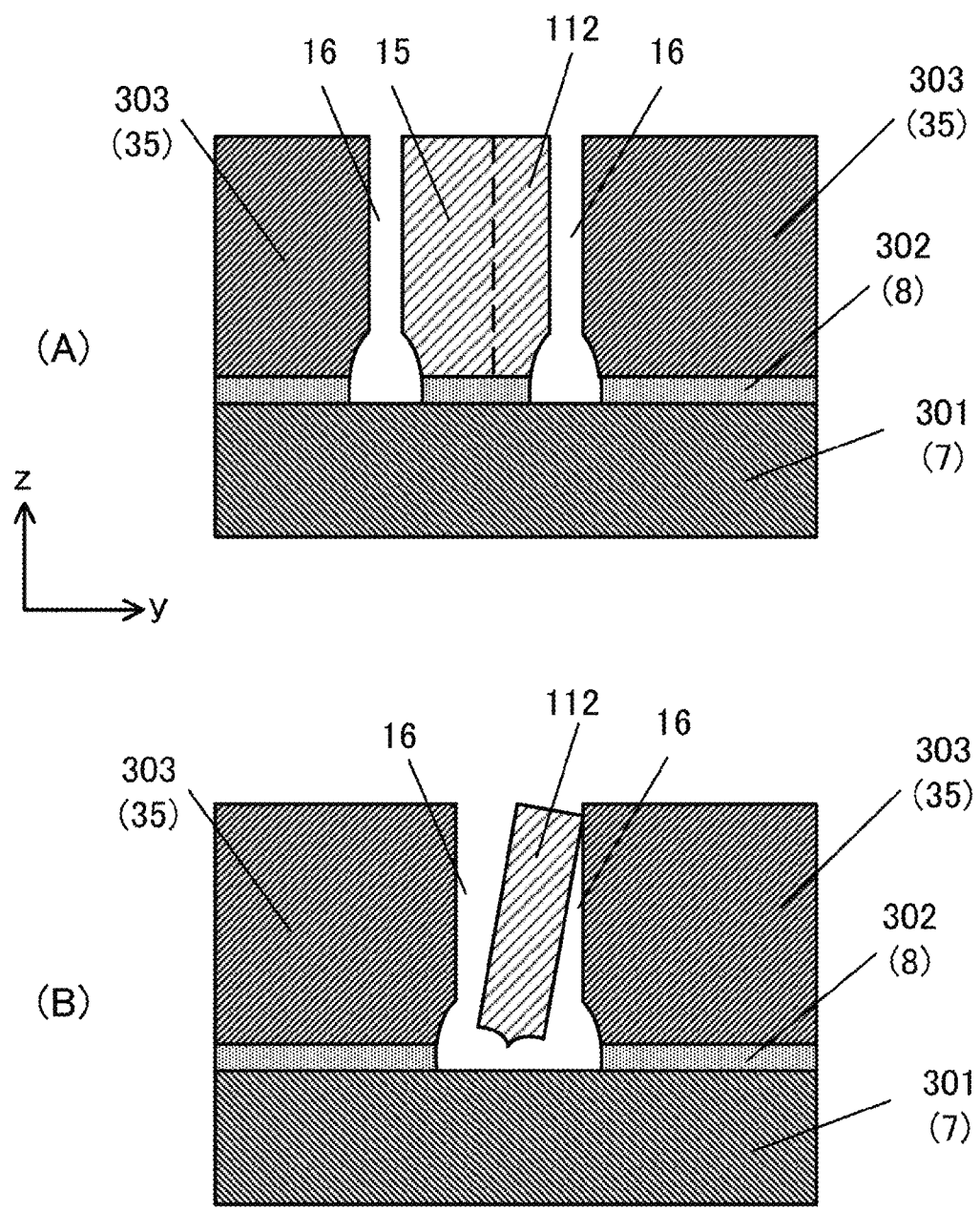
FIG. 7(A) is a cross-sectional view taken along the line VIIA-VIIA in FIG. 6.
FIG. 7(B) is a cross-sectional view of a structure of a region that corresponds to FIG. 7(A) in a comparative example.

FIG. 6 is an enlarged view of a region VI in FIG. 1, FIG. 7(A) is a cross-sectional view taken along the line VIIA-VIIA in FIG. 6, and FIG. 7(B) is a cross-sectional view of a structure of a region that corresponds to FIG. 7(A) in a comparative example.

On the lead portion 112 of the fixed electrode portion 11, the protruding portion 15 protruding toward the fixed-electrode outer periphery portion 35 is formed at a predetermined spot in an extending direction of the lead portion 112, that is, the x-axis direction.

The lead portion 112 and the fixed-electrode outer periphery portion 35 are separated from each other by the slit 16, which is formed concurrently with the step of forming the fixed electrode portion 11 and the movable electrode portion 12 by processing the device layer 303 by DRIE, as illustrated in FIG. 4(D). The step of forming the fixed electrode portion 11 and the movable electrode portion 12 and a step of forming the slit 16 between the fixed electrode portion 11 and the movable electrode portion 12 may be performed as separate steps.

In the step of forming the slit 16 by DRIE, the device layer 303 is removed entirely in a thickness direction (z-axis direction), and the insulation layer 302 is removed substantially entirely in the thickness direction. At this time, lower portions of the slit 16 side of the lead portion 112 and the fixed-electrode outer periphery portion 35, that is, the insulation layer 302 side are undercut.

FIG. 7(B) illustrates the comparative example in which no protruding portion 15 is formed on a lead portion 112. In the comparative example, the lead portion 112 has a width, in other words, a length in the y direction being small, and as a result, a portion of the lead portion 112 at which the lead portion 112 is fixed to an insulation layer 302 is almost lost by undercutting lower portions of the lead portion 112. As a result, the lead portion 112 may be suspended over the insulation layer 302, or a bonding portion of the lead portion 112 to the insulation layer 302 may be broken by a minor impact, as a result of which sticking causes the lead portion 112 to adsorb or contact the fixed-electrode outer periphery portion 35. That is, the lead portion 112 may become conductive to the fixed-electrode outer periphery portion 35, failing to keep electric insulation.

In contrast, in the structure according to the present embodiment in which the protruding portion 15 is formed on the lead portion 112, a total width of the lead portion 112 and the protruding portion 15 is large, as illustrated in FIG. 7(A). As a result, when the lower portions of the lead portion 112 and the protruding portion 15 are undercut, an area of the bonding portion to the insulation layer 302 is kept sufficiently. Consequently, a strength of bonding of the lead portion 112 including the protruding portion 15 to the insulation layer 302 is improved, the lead portion 112 is prevented from coming into contact with the fixed-electrode outer periphery portion 35, so that electric insulation between the lead portion 112 and the fixed-electrode outer periphery portion 35 can be kept.

The embodiment described above has the following effects.

The MEMS element 10 includes the base 7, the insulation layer 8 fixed to one surface of the base 7, the fixed electrode portions (first upper layer) 11, at least portions of which are fixed to the base 7 and each of which includes the lead portion 112 connected to the fixed-comb-teeth connecting portion 111, and the fixed-electrode outer periphery portion (second upper layer) 35 provided surrounding the lead portions 112 and disposed being separated from the lead portion 112 by the slits 16, and the lead portions 112 each includes, at its predetermined portion, the protruding portion 15 protruding toward the fixed-electrode outer periphery portion 35, and the protruding portions 15 are fixed to the insulation layer 8. In this structure, a width of each lead portion 112 at the predetermined spot at which the protruding portion 15 is provided is large. As a result, even after lead portions 112 and the protruding portions 15 are undercut when the slits 16 are formed by etching, insulation layers necessary for fixing the fixed electrode portions 11 are left. Consequently, a strength of the fixed electrode portions 11 can be kept, so that the electric insulation between the lead portion 112 and the fixed-electrode outer periphery portion 35 can be kept.

For the MEMS element 10 according to the present embodiment, it is only required that the protruding portions 15 protruding toward the fixed-electrode outer periphery portion 35 are formed at predetermined spots of the lead portions 112, and the production method is completely the same as in a case where the protruding portions 15 are not formed on the lead portions 112. Therefore, it is possible to improve productivity compared with a method in which protective films are formed at spots at which undercutting is to be prevented.

(Modifications)

The embodiment described above exemplifies the structure in which one protruding portion 15 is formed on each lead portion 112. However, a plurality of protruding portions 15 may be formed on each lead portion 112 along a longitudinal direction of the lead portion 112 at predetermined intervals.

Further, the embodiment described above exemplifies the structure in which the protruding portions 15 protrude toward the center band portion 121 of the moveable portion electrode portion 12. However, a structure in which the protruding portions 15 protrude in an opposite direction to the center band portion 121 of the moveable portion electrode 12 is possible. Further, in a case where a plurality of protruding portions 15 are formed on each lead portion 112, protruding portions 15 protruding toward the center band portion 121 and protruding portions 15 protruding in the opposite direction to the center band portion 121 may be provided on one lead portion 112.

Other Embodiments

The embodiment described above exemplifies the structure in which the protruding portions 15 are formed on the lead portions 112 of the fixed electrode portions 11. However, the protruding portions 15 may be formed on the fixed-comb-teeth connecting portions 111. An example of a formation spot in a case where the protruding portions 15 of the fixed-comb-teeth connecting portions 111 is illustrated as a formation position 15A in FIG. 1. In FIG. 1, the formation position 15A is illustrated for only one fixed electrode portion 11, but as a matter of course, the formation position 15A is formed on each fixed electrode portion 11. Further, a plurality of formation positions 15A may be provided to one fixed-comb-teeth connecting portion 111. A reason for forming the protruding portions 15 on the fixed-comb-teeth connecting portions 111 will be described below.

The fixed-comb-teeth connecting portion 111 is bonded to the insulation layer 8 at a region $11C_1$ linearly extending in the y direction in the hatched zone 11C illustrated in FIG. 3(B). As described in Japanese Patent Laid-Open No. 2018-88780, which is cited as Patent Literature 2, an advantageous structure for a vibration-driven energy harvesting device is a structure in which a Q factor of resonance of the movable electrode portion 12 is decreased to make a frequency of the resonance gentile, in other words, a structure that allows the resonance for a wide frequency band of outside vibration. To this end, it is necessary to decrease a parasitic capacitance that develops between the base 7 and the fixed electrode portions 11.

Therefore, a width (a length in the x-axis direction) of a bonding portion at which the fixed-comb-teeth connecting portion 111 is fixed to the insulation layer 8 illustrated as the region $11C_1$ in the hatched zone 11C has to be small. However, the smaller the width with which the fixed-comb-teeth connecting portion 111 is fixed to the insulation layer 8 becomes, the more the strength of bonding between the fixed-comb-teeth connecting portion 111 and the insulation layer 8 decreases by undercutting that occurs at bonding portions between the fixed-comb-teeth connecting portion 111 and the insulation layer 8 in the DRIE processing for forming the slit 16. Therefore, not by increasing the width of the fixed-comb-teeth connecting portion 111, that is, not by adopting a structure that makes the parasitism capacitance large, but by forming the protruding portion 15 at a predetermined spot of the fixed-comb-teeth connecting portion 111, in other words, by forming the protruding portion 15 partially, so as to increase the width of bonding between fixed-comb-teeth connecting portion 111 and the insulation layer 8 at the protruding portion 15, it is possible to keep a necessary strength of bonding without increasing the parasitic capacitance even after the fixed-comb-teeth connecting portion 111 is undercut.

Note that, since the fixed comb teeth 110 sides of the fixed-comb-teeth connecting portions 111 are positioned above the opening 7a formed in the base 7, the fixed-electrode outer periphery portion 35 cannot be provided around the fixed comb teeth 110 of the fixed-comb-teeth connecting portions 111. However, in all regions of the fixed-comb-teeth connecting portions 111 provided on the base, the fixed-electrode outer periphery portion 35 is provided, and there are no regions where peripheries of the fixed-comb-teeth connecting portions 111 are not covered. In the present specification, as long as the fixed-electrode outer periphery portion 35 is provided in all regions of the fixed-comb-teeth connecting portions 111 provided on the base in this manner, the structure in which the fixed-electrode outer periphery portion 35 is provided in the peripheries of the fixed-comb-teeth connecting portions 111 is considered to be included.

Although the embodiment described above exemplifies the MEMS element 10 as one being formed from an SOI substrate, the MEMS element 10 may be formed from a silicon substrate instead of an SOI substrate. Alternatively, glass, metal, alumina, and the like can be used instead of a silicon substrate.

In the embodiment described above, the MEMS element 10 is exemplified as a MEMS element for a vibration-driven energy harvesting device. However, the MEMS element 10 may be used for a vibration actuator that vibrates the movable electrode portion by receiving a drive voltage from the outside.

Alternatively, the MEMS element 10 can be applied to a microresonator having a structure in which a movable electrode and a fixed electrode are separated from each other by a slit, as described in Patent Literature 1 (Japanese Patent Laid-Open No. 2005-323039). The microresonator described in Patent Literature 1 has a function as a filter that extracts, from among vibrations occurring between one fixed comb teeth electrode and one movable comb teeth electrode, only a specific frequency from the other fixed comb teeth electrode.

Moreover, the structure of the MEMS element 10 according to the present embodiment can be applied to various types of sensors.

Various embodiments and modifications have been described above, but the present invention is not limited to these details. The various embodiments and modifications described above may be combined or may be altered as appropriate, and other aspects contemplated within the scope of the technical concept of the present invention are also included within the scope of the present invention.

The disclosure of the following priority application is incorporated herein by reference.

Japanese Patent Application No. 2019-187152 (filed on Oct. 10, 2019)

REFERENCE SIGNS LIST 1 vibration-driven energy harvesting device
7 base
8 insulation layer
10 MEMS element
11 fixed electrode portion (first upper layer)
12 movable electrode portion (moveable portion)
13 elastically-supporting portion
15 protruding portion
16 slit
35 fixed-electrode outer periphery portion (second upper layer)
111 fixed-comb-teeth connecting portion
112 lead portion

The invention claimed is:
1. A MEMS element comprising:
a base;
an insulation layer fixed to one surface of the base;
a first upper layer, wherein at least portions of the first upper layer are fixed to the insulation layer, wherein the first upper layer comprises fixed electrode portions, each fixed electrode portion having an electrode pad, a lead portion, and a fixed-comb-teeth connection portion; and
a second upper layer that surrounds the first upper layer, wherein the second upper layer is separated from the first upper layer by slits,
wherein:
the first upper layer includes, at predetermined portions, protruding portions protruding toward the second upper layer, wherein the protruding portions are provided on the lead portions of the fixed electrode portions at respective positions between the electrode pads and the fixed-comb-teeth connection portions or on the fixed-comb-teeth connection portions,
portions of the insulation layer beneath the first upper layer are removed,
the protruding portions have widths configured to fix the first upper layer to the insulation layer due to the removal of the portions of the insulation layer beneath the first upper layer, and
the protruding portions are fixed to the insulation layer.
2. The MEMS element according to claim 1, wherein the insulation layer is removed in regions corresponding to the slits, and the base is exposed in a thickness direction of the insulation layer through at least some of the regions corresponding to the slits.
3. The MEMS element according to claim 1, wherein the second upper layer is fixed to the insulation layer.
4. The MEMS element according to claim 1, wherein the base, the first upper layer, and the second upper layer are made of silicon.
5. The MEMS element according to claim 1, wherein the insulation layer is made of an inorganic insulation material.
6. The MEMS element according to claim 1, wherein the first upper layer includes a plurality of fixed comb teeth, and the insulation layer is removed in regions corresponding to between the fixed comb teeth formed adjacently.
7. A vibration-driven energy harvesting device comprising:
the MEMS element according to claim 6,
a moveable portion including a plurality of movable comb teeth meshing with the fixed comb teeth of the first upper layer;
elastically-supporting portions elastically supporting the moveable portion; and
an output portion outputting electric power that is generated by movement of electric charge occurring by relative movement between the fixed comb teeth and the movable comb teeth.
8. A MEMS element comprising:
a base;
an insulation layer fixed to one surface of the base;
a first upper layer, wherein at least portions of the first upper layer are fixed to the insulation layer, wherein the first upper layer comprises a fixed electrode portion having an electrode pad, a lead portion, and a fixed-comb-teeth connection portion; and
a second upper layer that surrounds the first upper layer, wherein the second upper layer is separated from the first upper layer by slits,
wherein:
the first upper layer includes, at a predetermined portion a protruding portion protruding toward the second upper layer, wherein the protruding portion is provided on the lead portion of the fixed electrode portion at a position between the electrode pad and the fixed-comb-teeth connection portion,
the protruding portion has a first width sufficient to fix the first upper layer to the insulation layer,
a lead portion of the first upper layer has a second width that is smaller than the first width and larger than a third width of the insulation layer beneath the lead portion,
the slits include a portion formed to follow a contour of the protruding portion, and
the protruding portions are fixed to the insulation layer.
9. The MEMS element according to claim 8, wherein
the first upper layer includes protruding portions at each of multiple predetermined portions,
the first upper layer includes electrode pads, lead portions, and fixed-comb-teeth connection portions, and
at least one of the protruding portions is provided on one or more of the lead portions, and each of the protruding portions protrudes toward the second upper layer.

\* \* \* \* \*